United States Patent
Ando

(10) Patent No.: US 7,459,768 B2
(45) Date of Patent: Dec. 2, 2008

(54) SEMICONDUCTOR WAFER AND DICING METHOD

(75) Inventor: Masateru Ando, Tokyo (JP)

(73) Assignee: Elpida Memory, Inc. (JP)

( * ) Notice: Subject to any disclaimer, the term of this patent is extended or adjusted under 35 U.S.C. 154(b) by 205 days.

(21) Appl. No.: 11/018,984

(22) Filed: Dec. 21, 2004

(65) Prior Publication Data

US 2005/0139964 A1 Jun. 30, 2005

(30) Foreign Application Priority Data

Dec. 24, 2003 (JP) ............................ 2003-426160

(51) Int. Cl.
*H01L 23/544* (2006.01)
(52) U.S. Cl. .............................. 257/620; 257/E23.179; 257/E21.523; 438/113; 438/458; 438/462
(58) Field of Classification Search ................ 257/620, 257/E23.179, E21.523; 438/113, 458, 462
See application file for complete search history.

(56) References Cited

U.S. PATENT DOCUMENTS

2001/0015476 A1* 8/2001 Tada .......................... 257/620

2002/0192928 A1* 12/2002 Kosugi ........................ 438/462
2003/0153172 A1* 8/2003 Yajima et al. ............... 438/612

FOREIGN PATENT DOCUMENTS

| JP | 03-129855 | 6/1991 |
| JP | 06-045437 | 2/1994 |
| JP | 2777426 | 5/1998 |
| JP | 2001-210609 | 8/2001 |

* cited by examiner

*Primary Examiner*—Leonardo Andujar
*Assistant Examiner*—Leslie Pilar Cruz
(74) *Attorney, Agent, or Firm*—Hayes Soloway P.C.

(57) ABSTRACT

In order to improve the yield by suppressing peeling or the like of an accessory pattern when dicing, there include: a substrate on which an element forming region and a scribe line region formed around the element forming region are provided; an accessory pattern formed on the scribe line region; a protective film covering the element forming region on the substrate; and supporting films located in the opening formed in the scribe line region and supporting the accessory pattern locally. Each of the supporting film is formed as a continuation of the protective film, and has a function of supporting an edge of the accessory pattern while avoiding a part along which the accessory pattern is diced with a dicing blade.

8 Claims, 5 Drawing Sheets

SEMICONDUCTOR WAFER AND DICING METHOD

BACKGROUND OF THE INVENTION

1. Field of the Invention

The present invention relates to a fabricating method of semiconductor devices such as LSIs, and in particular, to semiconductor wafers before being diced, and a dicing method.

2. Related Art

When a semiconductor device is fabricated, a photoresist film is patterned by using a stepping projection aligner (a stepper). When the patterning is performed, it is required that an alignment mark formed in advance on the semiconductor substrate in the previous step is detected by using a laser, and the gap between the original coordinate and the actual coordinate (due to the accuracy of the stepper in the previous step, stretch distortion of the wafer, and the like) is corrected on the basis of a diffraction ray generated from the alignment mark, to thereby perform an alignment. Thus, an accessory pattern including the alignment mark or TEG (test element group) for characteristic evaluations is provided. The accessory pattern is formed (in a scribe line region) independent from a region on which elements such as transistors are formed (an element forming region), without increasing the chip area. The TEG consists of a number of elements for evaluating device characteristics, for example, evaluating characteristics of MOS transistors and measuring contact resistance.

In the final stage, the scribe line region is diced so as to divide the element forming regions into pieces.

Methods for dividing respective element forming regions are described in Japanese Patent Application Laid-open No. 6-45437 (JP6-45437A) and Japanese Patent Application Laid-open No. 2001-210609 (JP2001-210609A). In the method disclosed in JP 6-45437A, an Al film is remained in between the semiconductor chip and an alignment mark in the scribe line, and the remained Al film is covered with an overcoat film. Then, the overcoat film and the Al film are diced with a dicing blade. In this method, there remains a problem that the overcoat film is adhered to the dicing blade so that the service life of the dicing blade becomes shortened.

In order to solve the aforementioned problem in the dicing method, a typical semiconductor wafer before being diced will be considered.

As shown in FIG. 1A, a semiconductor wafer 40 is provided with two divided regions on a substrate 41, that is, an element forming region 42 and a scribe line region 43 formed around the element forming region 42. In the scribe line region 43, an accessory pattern forming region 44 is provided, in which an accessory pattern consisting of a wiring layer is formed. Further, the element forming region 42 is covered with a protective film not shown.

On the element forming region 42, a semiconductor device such as an LSI is formed. The most part of the scribe line region 43 is chipped off when dicing. The accessory pattern may be an alignment mark for only being utilized during fabricating process, a TEG pad, or the like. By providing the accessory pattern forming region 44 not in the element forming region 42 but in the scribe line region 43, the area of the semiconductor chip can be reduced.

After the element forming region 42 is covered with the protective film, the scribe line region 43 is diced using a disk-shaped dicing blade. Thereby, the element forming regions 42 are divided into separate pieces of a semiconductor chip.

Next, the laminated structure of a DRAM and the specific configuration of the scribe line region 43 thereof will be explained. As shown in FIG. 1B, a DRAM is so formed that on a silicon substrate 50, an interlayer insulating layer 51, a top-layer wiring layer 52, and a photoresist layer 53a are laminated in sequence. Although FIG. 1B shows the scribe line region 43, this laminated structure is formed in the element forming region 42 as well.

The silicon substrate 50 is P-type. In the Figure, the thickness of the silicon substrate 50 is illustrated to be thinned comparing with the other parts, and only the scribe line region 43 is illustrated.

The interlayer insulating layer 51 consists of an SiO2 film, a TEOS(Tetra Ethyl Ortho Silicate)BPSG(Borophospho Silicate Glass) film, or the like, and has a thickness of about 4300 to 4800 nm, for example. Further, in the element forming region 42, the interlayer insulating layer 51 consists of an interlayer insulating film with at least three layers, such as an interlayer insulating film for insulating the element, the word line and the bit line from each other.

The top-layer wiring layer 52 is formed of a barrier metal layer 521 consisting of a Ti/TiN wiring layer with each thickness of about 30/100 nm, an Al wiring layer 522 with a thickness of about 800 nm, and a reflection protective film 523 consisting of a TiN wiring layer with a thickness of about 25 nm.

As shown in FIGS. 2A and 2B, the top-layer wiring layer 52 is patterned by using the photo-lithography technique and the etching technique to thereby form a wiring (not shown) in the element forming region 42, and at the same time, to form an accessory pattern 53 at a desired position in the scribe line region 43.

The accessory pattern 53 includes an alignment mark or a TEG pad. The accessory pattern 53 shown is a TEG pad conducting to the TEG 54 for evaluating characteristics of MOS transistor, measuring contact resistance and the like.

Next, in order to reduce the trap level generated in the fabricating process, hydrogen alloy processing for annealing at 400 to 450° C. in H2 atmosphere is performed. Then, as shown in FIG. 2A, a passivation film 55 with a thickness of about 600 nm consisting of an SiON film or the like is formed over the whole surface. Finally, as shown in FIG. 3A, a polyimide film 56 is deposited across the element forming region 42 and the scribe line region 43. Therefore, the accessory pattern 53 formed in the scribe line region 43 is covered with the passivation film 55 and the polyimide film 56 in two layers laminated above and below.

In order to divide the element forming regions into pieces, the scribe line region 43 is diced with a dicing blade. It is required to prevent the dicing blade from being adhered with the polyimide film 56 to prolong the service life of the dicing blade.

In view of the above, as shown in FIGS. 3A and 3B, it may be possible to remove the passivation film 55 and the reflection preventive film 523 deposited on the bonding pad (not shown) formed on the top-layer wiring layer 52 in the element forming region 42, and to partially remove the reflection preventive film 523, the passivation film 55 and the polyimide film 56 in the scribe line region 43, by using the photolithography technique and the etching technique. This is a method to completely prevent the contact between a dicing blade and the polyimide film 56, and to remain the passivation film 55 and the polyimide film 56, continuing to the passivation film 55 and the polyimide film 56 formed in the element forming region 42, in the scribe line region 43 in the dimension of a width W11, and to completely expose the accessory pattern 53 in the scribe line region 43.

For example, the width W10 of an opening 57 is 90 μm, the width W11 of the polyimide film 56 in the scribe line region 43 has a width W11 of 5 μm, and the width 12 from the boundary between the scribe line region 43 and the element forming region 42 to the accessory pattern 53 is 10 μm. In the Figure, each dimension is symmetrical with reference to the center of the scribe line region 43.

However, as a result of dicing performed using the structure shown in FIGS. 3A and 3B, the accessory pattern 53 was subject to peeling or curling up (hereinafter referred to as "peeling or the like") when being diced. This caused defects and a short of bonding wiring, whereby the yield dropped. With an identification of the cause, it was found that the accessory pattern 53 was formed on the interlayer insulating film 51, and when being diced with a dicing blade, the pattern was not supported in a fixed manner so it was in the free state.

SUMMARY OF THE INVENTION

It is therefore an object of the invention to provide a semiconductor wafer and a dicing method capable of improving the yield, by preventing a contact between a dicing blade and a polyimide film when dicing, and suppressing peeling or the like of an accessory pattern.

In order to achieve the aforementioned object, a semiconductor wafer according to the present invention comprises: a substrate on which an element forming region and a scribe line region formed around the element forming region are provided; an accessory pattern formed on the scribe line region; a protective film for covering the element forming region of the substrate; and supporting films, located in an opening formed in the scribe line region, for covering the accessory pattern locally. The supporting films are formed continuing to the protection films, and has a function of supporting edges of the accessory pattern while avoiding a part along which the accessory pattern is diced with a dicing blade. The surface of the accessory pattern is directly exposed in the opening. The supporting films are formed symmetrically with reference to a line along which the accessory pattern is diced with the dicing blade. The supporting films are formed only on a part where the accessory pattern is formed, and a width of an opening of a part where the supporting film is not formed in the scribe line region is enlarged by protruded amounts of the supporting films protruded in the opening. Here, the surface of the accessory pattern is directly exposed in the opening. Further, the protective film, serving as the supporting film, includes at least a polyimide film.

Further, in order to divide element forming regions into pieces by using a dicing method according to the present invention, the following steps are performed in sequence: exposing the surface of the accessory pattern in the opening of the scribe line region, and supporting the edges of the accessory pattern with the supporting films; and positioning a dicing blade at the opening of the scribe line region, and dicing the scribe line region with the dicing blade. The edges of the accessory pattern are supported by the supporting films at positions symmetrical with reference to a line along which the accessory pattern is diced with the dicing blade.

Since the edges of the accessory pattern are supported with the supporting films, the accessory pattern is held down with the supporting films. Whereby, the accessory pattern is less susceptible to peeling or the like when being diced. Further, only parts of the accessory pattern are covered with the protective films, the influence of the protective films on a dicing blade is small.

Further, in the semiconductor wafer according to the present invention, areas from the boundaries between the scribe line region and the element forming regions formed on both sides thereof to the positions inside the scribe line region 43 by a certain distance D1, are covered with the protective films. With these protective films, the both edges of the accessory pattern are covered.

The accessory pattern is subject to peeling from either edge orthogonal to the scribe line. In view of this problem, the both edges of the accessory pattern are covered with supporting films, which enables to prevent peeling of the accessory pattern. The certain distance described above does not reach a part cut out in the dicing step. Since a dicing blade does not contact the protective films, an influence of the protective films on the dicing blade can be reduced significantly.

A polyimide film shortens the service life of a dicing blade by causing clogging in the dicing blade. In the present invention, an influence of the protective films on the dicing blade is suppressed, while reducing peeling of the accessory pattern. Therefore, the present invention is useful in using a polyimide film as a protective film.

The present invention will be explained more specifically. The present invention relates to the structure of an accessory pattern in a semiconductor device. In particular, the present invention enables to improve the yield without increasing the conventional number of steps in the assembling step in a fabricating process of a semiconductor device. An example of the fabricating method includes the steps of: forming a scribe line region at a predetermined position (a region other than an element forming region) on a semiconductor substrate; forming an interlayer insulating film on the semiconductor substrate, forming an accessory pattern consisting of a top-layer wiring layer at a prescribed position in the scribe line region; forming a passivation film and a polyimide film in sequence; forming an opening by removing a predetermined portion of the polyimide film and the like in the element forming region and the scribe line region by using the photolithography technique and the etching technique, and at the same time, forming overlap margins for holding down parts of the accessory pattern with the passivation film and the polyimide film.

In the present invention, overlap margins to the accessory pattern is formed with the passivation films and the polyimide films, which enables to prevent peeling or the like of the accessory pattern when dicing. Therefore, it is possible to improve the yield in the assembling step without adding any further step to the conventional number of steps and without extremely deteriorating the service life of a dicing blade.

Further, the present invention has such a configuration that only the accessory pattern is held down locally with the passivation films and the polyimide films. Thereby, it is possible to further improve the service life of the dicing blade, and to achieve the aforementioned effects.

(Effects)

According to the present invention, since the accessory pattern is held down with the supporting films, peeling or the like of the accessory pattern when dicing can be reduced. Thereby, the yield in the assembling process can be improved. Further, since only parts of the accessory pattern are covered with the protective films, an influence of the protective films on the dicing blade can be suppressed to minimum.

Further, since the protective films are not formed on a part cut out in the dicing step, the influence of the protective films on the dicing blade can be reduced significantly.

Further, if the protective film includes a polyimide film, the polyimide film causes clogging in the dicing blade. Therefore, the present invention, in which an influence of the protective film on the dicing blade is suppressed while reducing peeling of the accessory pattern, is useful.

PREFERRED EMBODIMENTS OF THE INVENTION

Figure 4A:
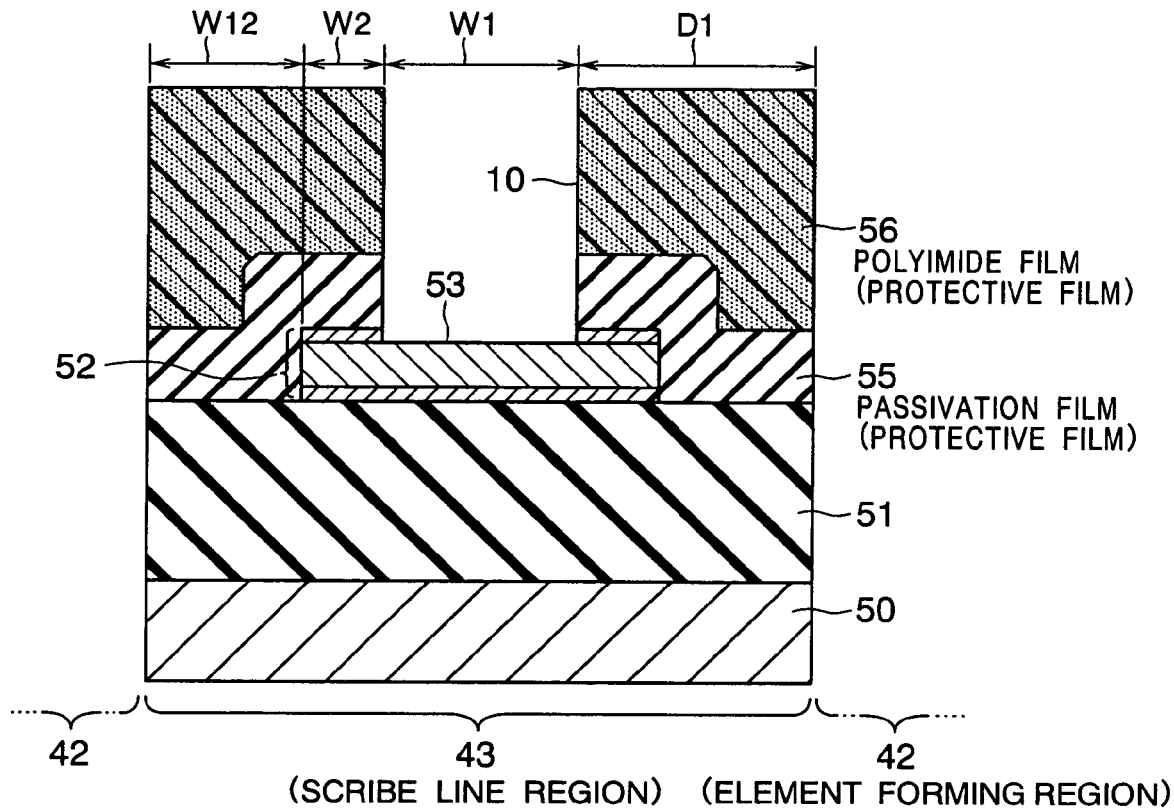
FIG. 4A is a cross-sectional view, showing a first embodiment of a semiconductor wafer and a dicing method according to the present invention, taken along the line IV-IV in FIG. 4B.
Figure 4B:
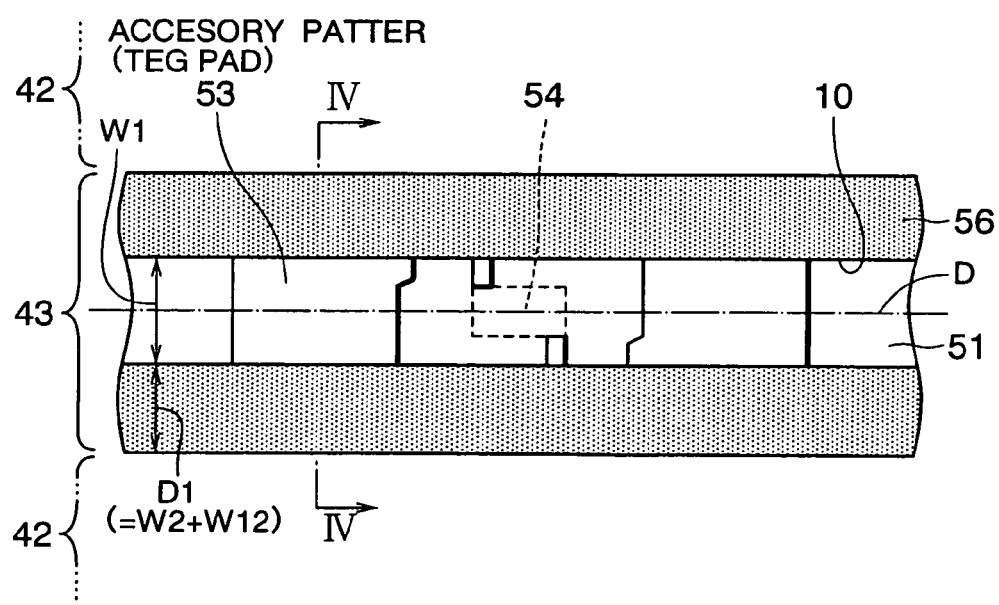
FIG. 4B is a plan view showing the first embodiment of the semiconductor wafer and the dicing method according to the present invention.

FIGS. 4A and 4B show a first embodiment of a semiconductor wafer and a dicing method according to the present invention. FIG. 4A is a cross-sectional view taken along the line IV-IV in FIG. 4B, and FIG. 4B is a plan view. Hereinafter, explanation will be given based mainly on these Figures. Same parts as those in FIGS. 1A, 1B, 2A and 2B are denoted by the same reference numerals.

After the polyimide film 56 is deposited across the whole surface, the reflection protective film 523 (FIG. 2A), the passivation film 55 and the polyimide film 56 are partially removed. The portions to be removed are parts on a bonding pad (not shown) in the element forming region 42 and a part in the scribe line region 43.

Thereby, the scribe line region 43 is provided with an opening 10 for accepting a dicing blade. At the bottom of the opening 10, a part of the accessory pattern 53 is exposed. Here, in order to hold down a part of the accessory pattern 53 with the passivation film 55 and the polyimide film 56, an overlap margins W2 of about 5 to 10 µm, for example, are secured. The protective films (55, 56) of the overlap margins are so formed as to be protruded in the scribe line region 43, as continuations of the protective films (55, 56) covering the element forming region 42. The protective films (55, 56) of the overlap margin W2 are used as supporting films. The accessory pattern 53 is so supported that the edges thereof are covered with the supporting films (55, 56) within the range of the overlap margins W2. Here, the overlap margins W2 are defined within a range where a dicing blade and inner faces of the supporting films (55, 56) do not contact with each other.

As shown with an alternate long and short dash line in FIG. 4B, the knife edge of a dicing blade is positioned on a line across almost the center of the TEG 54 located between two accessory patterns (TEG pads). Thereby, the supporting films (55, 56) opposite to each other in the opening 10 are formed at positions bilaterally symmetrical with reference to the dicing line shown with the alternate long and short dash line D.

Figure 1A:
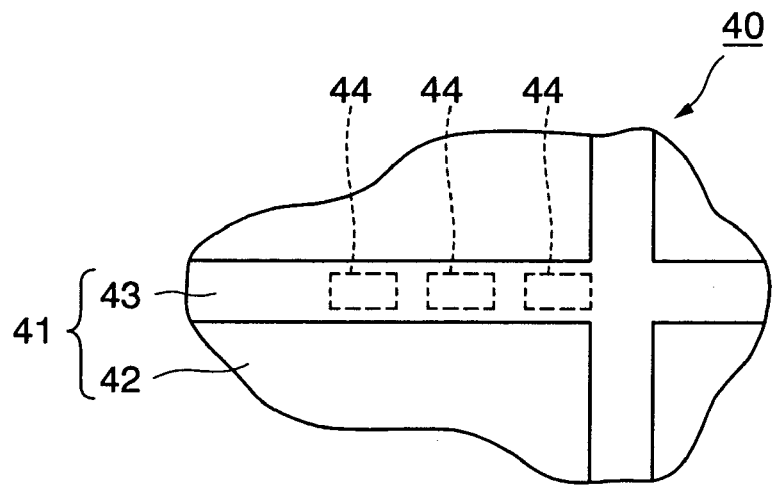
FIG. 1A is a plan view showing a part of a typical semiconductor wafer before being diced.
Figure 1B:
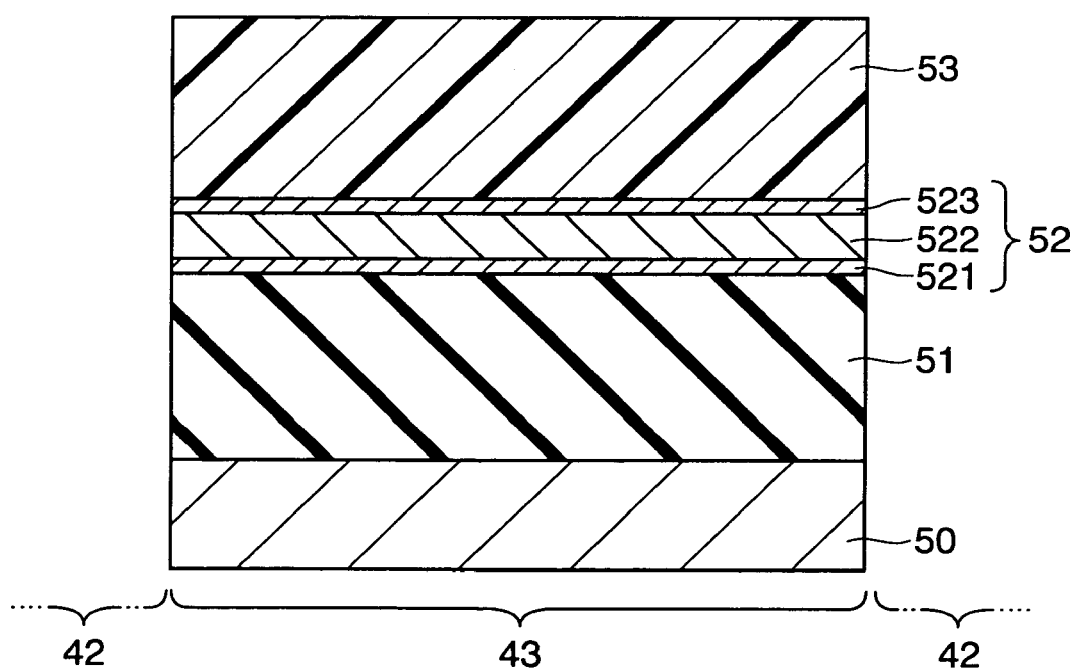
FIG. 1B is a cross-sectional view showing a fabricating process in the conventional art.
Figure 2A:
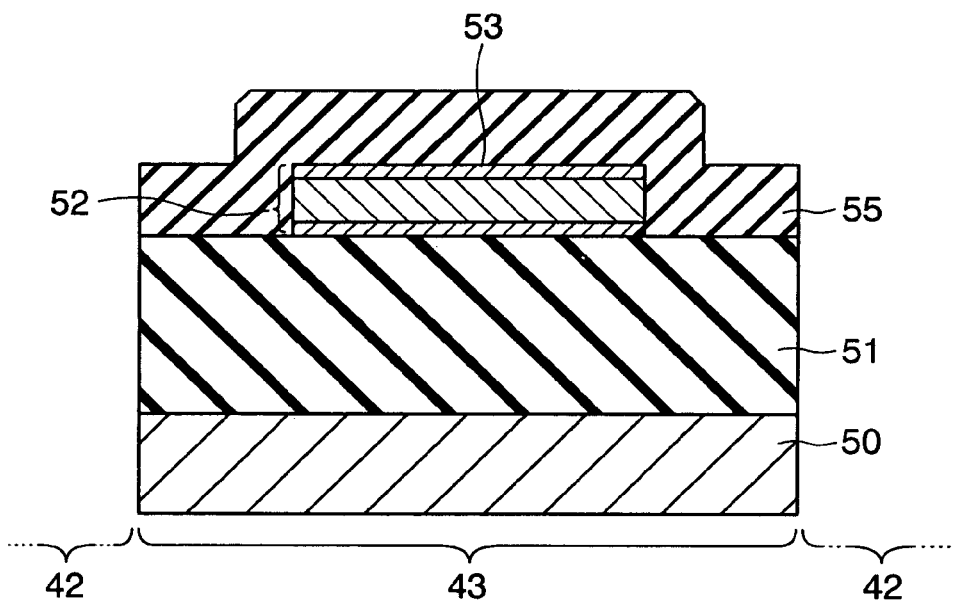
FIG. 2A is a cross-sectional view, showing a fabricating process in the conventional art, taken along the line II-II in FIG. 2B.
Figure 2B:
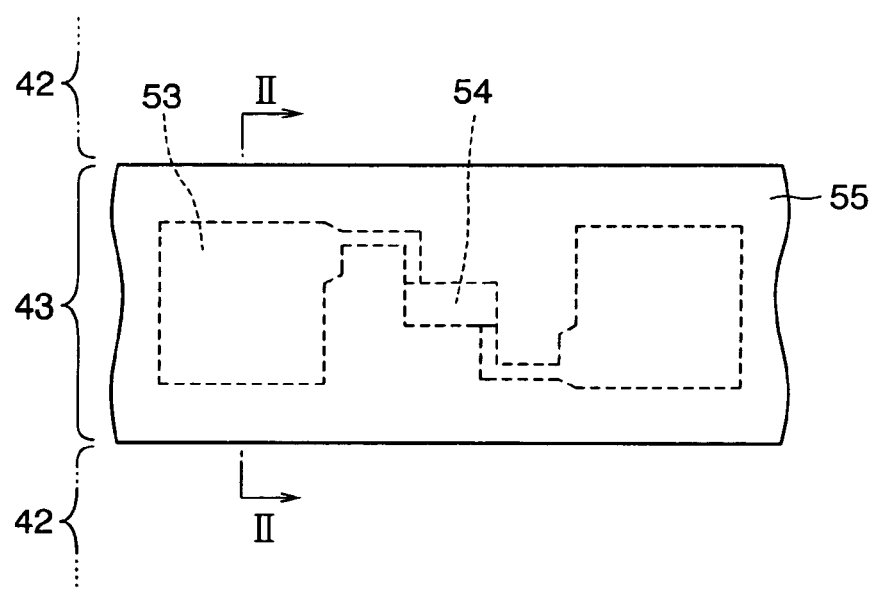
FIG. 2B is a plan view showing the conventional art.
Figure 3A:
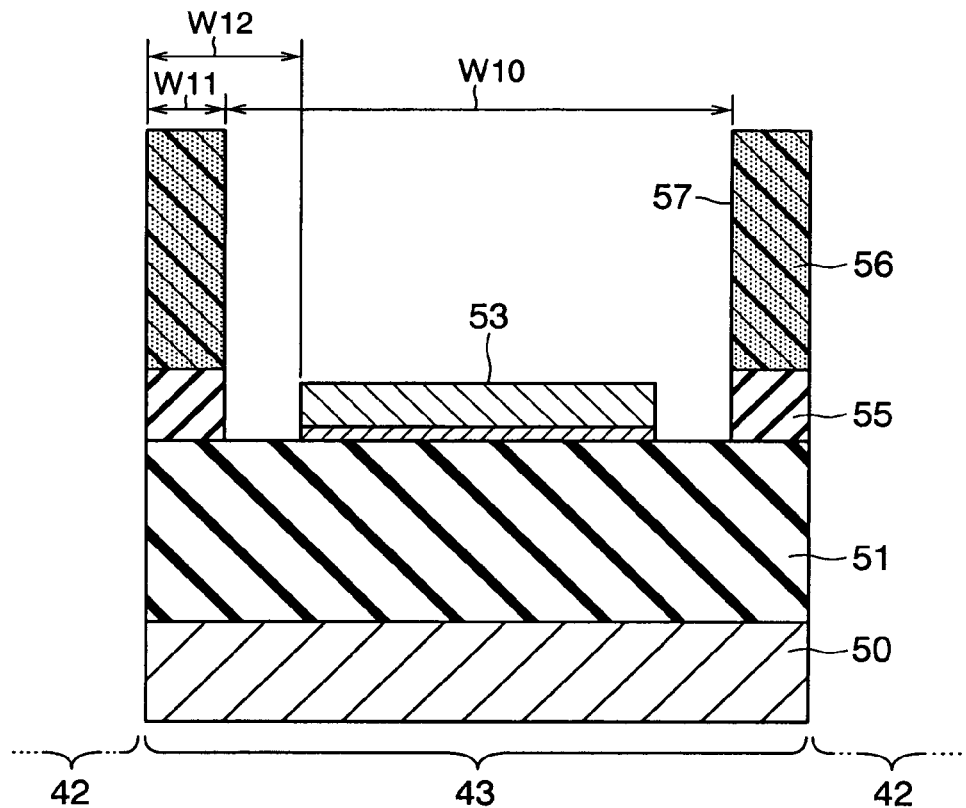
FIG. 3A is a cross-sectional view, showing a fabricating process in the conventional art, taken along the line III-III in FIG. 3B.
Figure 3B:
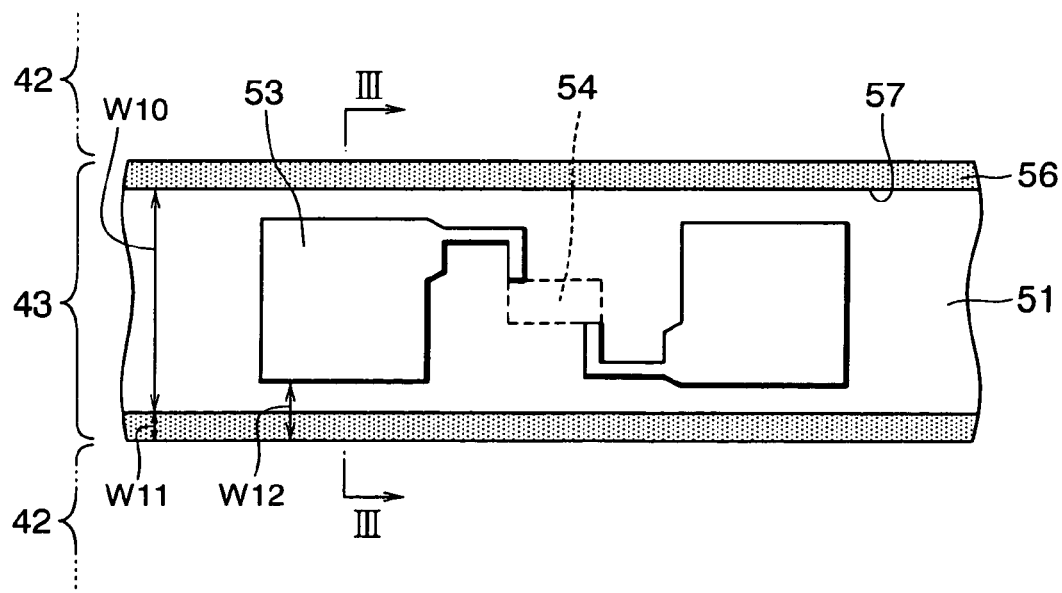
FIG. 3B is a plan view showing the conventional art.

In the example shown in FIGS. 3A and 3B, priority is placed on a prevention of adherence of the polyimide film 56 to the dicing blade. Thereby, the polyimide film 56 in the scribe line region 43 has a width W11 enough for covering the boundary between the scribe line region 43 and the element forming region 42 (5 µm, for example). With such an extremely wide opening 57, there is nothing to hold down the accessory pattern 53 in the scribe line region 43, which causes peeling or the like of the accessory pattern 53 when dicing.

On the other hand, the present invention has a structure in which a part of the accessory pattern 53 are intentionally held down by the passivation films 55 and the polyimide films 56. This can prevent peeling or the like of the accessory pattern when dicing, without adding a process to the conventional process, and without extremely deteriorating the service life of the dicing blade. Consequently, the yield in the assembling process can be improved.

As shown in FIG. 4A, the semiconductor wafer of the present embodiment is divided into the element forming region 42 and the scribe line region 43, on the silicon substrate 50. The element forming region 42 is covered with the passivation film 55 and the polyimide film 56. In the scribe line region 43, the accessory pattern 53 consisting of the top-layer wiring layer 52 is exposed, and parts of the accessory pattern 53 is covered with the passivation films 55 and the polyimide films 56. According to a dicing method of the present embodiment, in the semiconductor wafer in which two divided regions, that is, the element forming region 42 and the scribe line region 43, are formed on the silicon substrate 50, and the accessory pattern consisting of the top-layer wiring layer 52 is exposed in the scribe line region 43, the element forming region 42 is covered with the passivation film 55 and the polyimide film 56, and then, the scribe line region 43 is diced using a dicing blade. When the element forming region 42 is covered with the passivation film 55 and the polyimide film 56, parts of the accessory pattern 43 are also covered with the passivation films 55 and the polyimide films 56.

Then, as shown with the alternate long and short dash line in FIG. 4B, the knife edge of the dicing blade is positioned on a line across the almost center of the TEG 54 located between two accessory patterns (TEG pads), and the scribe line region 43 is diced along the dicing line shown with the alternate long and short dash line D. Thereby, the accessory pattern 53 and the TEG 54 are diced into right and left pieces.

Parts of the accessory pattern 53, in particular, the opposing edges thereof, are covered with the passivation films 55 and the polyimide films 56, so that the accessory pattern 53 is held down with the passivation films 55 and the polyimide films 56. Thereby, the accessory pattern 53 is less susceptible to peeling or the like when being diced. Further, since only some parts of the accessory pattern are covered with the passivation films 55 and the polyimide films 56, an influence of the polyimide films 56 on the dicing blade is small.

Further, in the present embodiment, the passivation films 55 and the polyimide films 56 cover areas from the boundaries between the scribe line region 43 and the element forming regions 42, 42 on both sides thereof to the positions inside the scribe line region 43 by a certain distance D1, whereby the both edges of the accessory pattern 53 are covered with the passivation films 55 and the polyimide films 56. The accessory pattern 53 is easily peeled from either edge orthogonal to the scribe line. In view of this problem, the both edges of the accessory pattern 53 are covered with the passivation films 55 and the polyimide films 56, whereby the peeling or the like of the accessory pattern 53 can be prevented with minimum amounts of passivation films 55 and polyimide films 56.

Next, specific examples of numerical values will be explained. The width W1 of the opening 10 is 60 to 70 µm, the width W2+W12 of the polyimide film 56 in the scribe line region 43 is 15 to 20 µm, and the wide W12 from the boundary between the scribe line region 43 and the element forming region 42 to the accessory pattern 53 is 10 μm. Each dimension in the Figure is symmetrical with reference to the center of the scribe line region 43.

Figure 5:
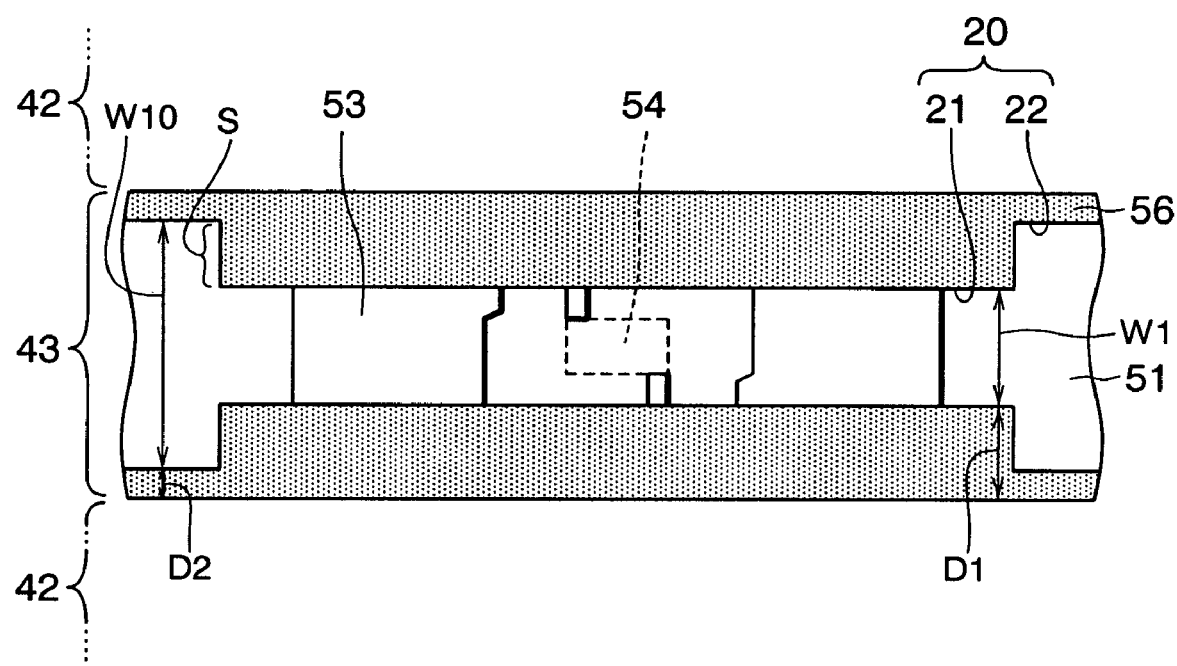
FIG. 5 is a plan view showing a second embodiment of a semiconductor wafer and a dicing method according to the present invention.

FIG. 5 is a plan view showing a second embodiment of a semiconductor wafer and a dicing method according to the present invention. Since the cross-sectional view showing the accessory pattern is same as that shown in FIG. 4A, it is omitted. Hereinafter, an explanation will be given according to FIGS. 4A and 5. The same parts as those in FIGS. 4A and 4B are denoted by the same reference numerals.

The present embodiment has such a feature that the supporting films (55, 56) are formed in a part where the accessory pattern 53 is provided, and the width of the opening in the scribe line region where no supporting film is formed is enlarged by the protruding amounts S of the supporting films (55, 56) protruding into the opening. More specific explanation will be given.

In the present embodiment, the supporting films consisting of the passivation films 55 and the polyimide films 56 are formed so as to protrude in the opening only on a part where the accessory pattern 53 exists. With these supporting films, the both edges of the accessory pattern 53 are held down locally. On the other hand, in the area where the accessory pattern does not exist, the width of the opening in the scribe line region is enlarged by the protruding amounts S of the supporting films protruding into the opening.

The accessory pattern 53 is not provided all over the scribe line region 43 but provided at a specific position of the scribe line region 43. Therefore, the scribe line region 43 other than the area on which the accessory pattern is formed is an open space. In the present embodiment, the supporting films (55, 56) are formed only on the part on which the accessory pattern 53 is formed, and in the area where the accessory pattern does not exist, the width of the opening in the scribe line region is enlarged by the protruding amounts S of the supporting films protruded in the opening. Thereby, the setting position of the dicing blade relative to the substrate 50 is shifted, so even if the dicing blade contacts the polyimide film 56, the contact is limited to a specific part where the accessory pattern 53 is formed. Thereby the service life of the dicing blade can be prolonged much longer comparing with that of the first embodiment. In the present embodiment, the both edges of the accessory pattern 53 are held down with the supporting films as well, which can prevent the accessory pattern from being peeled.

In other words, the opening 20 consists of a narrow opening 21 in the part with the accessory pattern 53, and a wide opening 22 in the part without the accessory pattern 53. Assuming that a certain distance covered with the passivation film 55 and the polyimide film 56 in the opening 21 is D1, and that in the opening 22 is D2, the relationship of D1>D2 is established. Thereby, it is possible to cover the both edges of the accessory pattern 53 with sufficient passivation films 55 and the polyimide films 56, and to reduce the passivation films 55 and the polyimide films 56 on the part without the accessory patterns 53. This enables to sufficiently suppress the peeling or the like of the accessory pattern 53 while significantly reducing the influence of the polyimide films 56 on the dicing blade.

Next, specific examples of numerical values will be explained. The width W1 of the opening 21 is 60 to 70 μm, the width 10 of the opening 22 is 90 μm. Other dimensions are same as those of the embodiment 1. Each dimension in the Figure is symmetrical with reference to the center of the scribe line region 43.

Of course, the first and second embodiments described above do not limit the present invention. For example, although a fabricating method in a DRAM has been shown, the present invention can easily been applied to other semiconductor devices. As the accessory pattern, an alignment mark may be used instead of the TEG pad. The protective film may consist solely of a polyimide film.

INDUSTRIAL AVAILABILITY

As described above, according to the present invention, the surface of the accessory pattern is exposed in the opening of the scribe line region, and the both edges of the accessory pattern are supported with the supporting films while avoiding the dicing part. Thereby, it is possible to reduce peeling or the like of the accessory pattern when the scribe line region is diced.

Further, the supporting films are provided only on the limited part where the accessory pattern is formed. Thereby, it is possible to reduce opportunities that the dicing blade and the supporting films contact with each other. This enables to prolong the service life of the dicing blade.

What is claimed is:

1. A semiconductor wafer comprising:
   a substrate on which an element forming region and a scribe line region formed around the element forming region are provided;
   an accessory pattern having a TEG pad formed on the scribe line region;
   a protective film for covering the element forming region of the substrate; and
   supporting films, located in an opening formed in the scribe line region, for covering a portion of the accessory pattern locally, wherein
   the supporting films support edges of the TEG pad while avoiding a portion of a scribe line region along which the accessory pattern is diced with a dicing blade; and
   a portion of a surface of the TEG pad not covered by the supporting films is directly exposed in the opening, wherein the supporting films are formed only on a part where the accessory pattern is formed, and a width of an opening of an area where the supporting film is not formed in the scribe line region is increased by protruding amounts of the supporting films in the opening.

2. The semiconductor wafer as claimed in claim 1, wherein the supporting films are formed symmetrically with reference to a line along which the accessory pattern is diced with the dicing blade.

3. The semiconductor wafer as claimed in claim 1, wherein each of the supporting films is formed of a protective film provided in the scribe line region as a continuation of the protective film covering the element forming region.

4. The semiconductor wafer as claimed in claim 3, wherein the protective film includes at least a polyimide film.

5. A dicing method for dicing a scribe line region formed around an element forming region provided on a substrate, the method comprising the steps of:
   providing a substrate having a scribe line region and an accessory pattern formed thereon, the accessory pattern having a TEG pad;
   forming supporting films so as to cover only the edges of the TEG pad where the accessory pattern is formed, which is located in an opening formed in the scribe line region, and not to cover the portion of the TEG pad where the pad is to be diced; and
   positioning a dicing blade at an opening of the scribe line region, and dicing the scribe line region with the dicing blade while avoiding contact of the dicing blade with the supporting films and a width of an opening of a part where the supporting films are not formed in the scribe line region is enlarged by protruding amounts of the supporting films protruding into the opening.

6. The dicing method as claimed in claim 5, wherein the edges of the accessory pattern are supported by the supporting films at positions symmetrical with reference to a line along which the accessory pattern is diced with the dicing blade.

7. The dicing method as claimed in claim 5 wherein, the edges of the accessory pattern are supported by using protective films as the supporting films, each of which is formed as a continuation of a protective film covering the element forming region.

8. The dicing method as claimed in claim 7, wherein a film including at least a polyimide film is used as the protective film.

* * * * *